United States Patent
Bao et al.

(10) Patent No.: US 8,766,730 B2
(45) Date of Patent: Jul. 1, 2014

(54) FREQUENCY TUNABLE SIGNAL SOURCE

(75) Inventors: Mingquan Bao, Vastra Frolunda (SE); Herbert Zirath, Molndal (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/641,841

(22) PCT Filed: Apr. 21, 2010

(86) PCT No.: PCT/EP2010/055259
§ 371 (c)(1), (2), (4) Date: Oct. 17, 2012

(87) PCT Pub. No.: WO2011/131237
PCT Pub. Date: Oct. 27, 2011

(65) Prior Publication Data
US 2013/0038376 A1    Feb. 14, 2013

(51) Int. Cl.
*H03B 27/00*    (2006.01)

(52) U.S. Cl.
USPC ............... 331/46; 331/49; 327/113; 327/116; 327/355; 327/356

(58) Field of Classification Search
USPC .......... 327/105, 113, 116, 355, 356; 455/323; 331/2, 37, 42, 46, 49, 53
See application file for complete search history.

(56) References Cited

U.S. PATENT DOCUMENTS 7,701,300 B2 *   4/2010   Park et al. .................. 331/40
8,543,055 B1 *   9/2013   Cook et al. ................. 455/20
8,543,077 B2 *   9/2013   Rafi et al. ................... 455/323

FOREIGN PATENT DOCUMENTS

GB    2136238 A    9/1984

OTHER PUBLICATIONS

Budreau, A.J., et al., "A Review of SAW-Based Direct Frequency Synthesizers", IEEE Transactions on Microwave Theory and Techniques, IEEE Service Center, Piscataway, NJ, US, vol. 30, No. 5, May 1, 1982, pp. 686-693, XP011243853.

Zhang, P., et al., "A New RF Front-End and Frequency Synthesizer Architecture for 3.1-10.6 GHz MB-OFDM UWB Receivers", Circuits and Systems, 2005, 48th Midwest Symposium on Cincinnati, Ohio, Aug. 7-10, 2005, Piscatway, NJ, US, Aug. 7, 2005, pp. 1119-1122, XP010895338.

* cited by examiner

*Primary Examiner* — Arnold Kinkead
(74) *Attorney, Agent, or Firm* — Rothwell, Figg, Ernst & Manbeck, P.C.

(57) ABSTRACT

A frequency tunable signal source (100) with first (105) and a second (115, 315) oscillators, each of which outputs a signal at a fundamental frequency ($f_1$, $f_2$) and at least one signal at a harmonic frequency ($f_1'$, $f_2'$) and a mixer (120) with first (121) and second (122) input ports and an output port (124), and a control unit (110) which controls switches ($S_1$, $S_2$, $S_3$, $S_4$), by means of which two of said signals ($f_1$, $f_2$, $f_1'$, $f_2'$) are switchably connected to the first input port. The other two signals are switchably to the other input port, with one switch ($S_1$, $S_2$, $S_3$, $S_4$) for each signal ($f_1$, $f_2$, $f_1'$, $f_2'$). There is also comprised a third oscillator (125), with an output signal connected to a third input port (123) of the mixer (120). At least one of the oscillators (105, 115, 315, 125) is a VCO, a Voltage Controlled Oscillator.

10 Claims, 3 Drawing Sheets

| $S_1$ | 0 | 0 | 1 |
|---|---|---|---|
| $S_2$ | 1 | 0 | 0 |
| $S_3$ | 0 | 1 | 0 |
| $S_4$ | 0 | 0 | 1 |
| Frequency | $2f_1$ | $2f_2$ | $f_1+f_2; f_1-f_2$ |

| | $S_1$ | $S_2$ | $S_3$ | $S_4$ |
|---|---|---|---|---|
| $f_1$ | 1 | 0 | 0 | 0 |
| $2f_1-f_2$ | 0 | 1 | 1 | 0 |
| $f_1+f_2$ | 1 | 1 | 0 | 0 |
| $2f_1$ | 0 | 0 | 1 | 0 |
| $f_1+2f_2$ | 1 | 0 | 0 | 1 |

FREQUENCY TUNABLE SIGNAL SOURCE

CROSS-REFERENCE TO RELATED APPLICATION

This application is a 35 U.S.C. §371 National Phase Entry Application from PCT/EP2010/055259, filed Apr. 21, 2010, and designating the United States.

TECHNICAL FIELD

The present invention discloses an improved tunable signal source.

BACKGROUND

The demand for tunable signal sources with low phase noise and a wide tuning range is growing, particularly tunable signal sources which can be used in higher frequency ranges, e.g. at 60 GHZ and above. Such a signal source can be used in a variety of technical fields such as, for example, radars and telecommunications.

One commonly used approach to obtain a high frequency signal source is to design a low frequency VCO, Voltage Controlled Oscillator, and to then apply frequency multipliers to up-convert the frequency of the VCO. Although it in this way is relatively easy to obtain an improvement in phase noise performance compared to a high frequency VCO, the phase noise degrades by 6 dB at every doubling of the oscillation frequency. This phase noise degradation, which accompanies an increase in frequency, can be alleviated by using a mixer and a fixed frequency oscillator in order to up-convert the frequency. Unfortunately, this approach has the drawback of having a relatively small tuning range, since the absolute tuning range determined by the low frequency VCO is unchanged in the frequency up-conversion.

SUMMARY

As explained above, there is a need for a high frequency signal source which has improved properties with respect to phase noise and tuning range compared to previously known such signal sources.

A purpose of the present invention is to offer such a high frequency signal source. This purpose is met by the present invention in that it discloses a frequency tunable signal source which comprises a first and a second oscillator, each of which has as its output a signal at a fundamental frequency and at least one signal at a harmonic frequency of the fundamental frequency.

The frequency tunable signal source of the invention also comprises a mixer with a first and a second input port as well as an output port, and further comprises a control unit which controls ON/OFF switches, by means of which switches two of said signals are switchably connected to the first input port and the other two signals are switchably to the other input port, with one switch for each signal.

In addition, the frequency tunable signal source also comprises a third oscillator which produces an output signal which is connected to a third input port of the mixer, and at least one of the first, second and third oscillators is a VCO, a Voltage Controlled Oscillator.

By means of the invention, as will be explained in the detailed description given in this text, a frequency tunable signal source with low phase noise is obtained, which can be used at high frequencies.

In one embodiment of the frequency tunable signal source of the invention, the third oscillator is a fixed frequency oscillator, an FFO.

In one embodiment of the frequency tunable signal source of the invention, at least one of the first and second oscillators is a VCO.

In one embodiment of the frequency tunable signal source of the invention, one of the first and second oscillators is an FFO.

BRIEF DESCRIPTION OF THE DRAWINGS

The invention will be described in more detail in the following, with reference to the appended drawings, in which.

DETAILED DESCRIPTION

The invention will be described in detail below, and the terms "fundamental frequency" and "harmonic frequency" will be used. These terms can briefly be defined as follows: A periodic signal can be expressed by means of, for example, a Fourier series with the components $N*f_0$, where $f_0$ is the signal's fundamental frequency and N is an integer. Thus:

N=1 gives us the signal's fundamental frequency, also known as the first harmonic, and N=2 gives us the signal's second harmonic, and N=3 gives us the signal's third harmonic, etcetera.

Figures 1, 2:
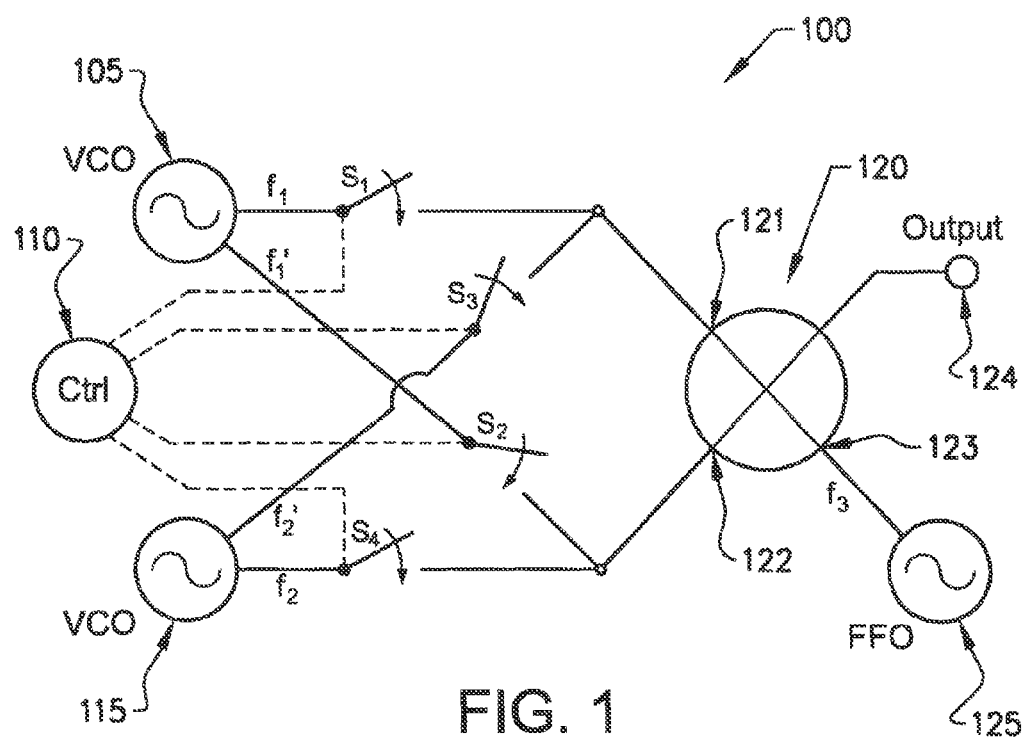
FIG. 1 shows a first embodiment of the invention.
FIG. 2 shows states of the embodiment of FIG. 1.

FIG. 1 shows a first embodiment 100 of a tunable signal source of the invention. In this embodiment, the tunable signal source comprises a first 105 and a second 115 Voltage Controlled Oscillator, VCO. Each of the VCOs 105, 115, has two output signals, a first output signal at a fundamental frequency of the VCO, shown in FIG. 1 as $f_1$ and $f_2$, respectively, and a second output signal at a harmonic frequency of the fundamental frequency, where the harmonic frequencies can, in principle, be any harmonic of the fundamental frequency, and which will from now on merely be referred to as "harmonic frequencies". The output signals at the harmonic frequencies of the first 105 and second 115 VCO are shown as $f_1'$ and $f_2'$ respectively in FIG. 1. In principle any harmonic frequency of the fundamental frequency can be used, e.g. $2^{nd}$, $3^{rd}$, etc, as well as the $1^{st}$, i.e. the fundamental frequency. In addition, there is no need to use the same harmonic from both oscillators, i.e. the $2^{nd}$ harmonic from one oscillator and the $3^{rd}$ harmonic from the other oscillator can be used. However, the invention will be described below with reference to an embodiment in which the second harmonic from both oscillators is used.

The embodiment 100 also comprises a mixer 120 with a first 121 and a second 122 input port as well as an output port 124. The output signals from the two VCOs 105, 115 are connected pair-wise to the input ports 121, 122 of the mixer via ON/OFF switches shown as $S_1$-$S_4$ in FIG. 1, with one switch being used for each signal. The switches $S_1$-$S_4$ are controlled by a control unit 110, and are suitably controlled so that only one signal at a time reaches each of the input ports 121, 122, i.e. only one of $S_1/S_3$ and one of $S_4/S_2$ should be closed at the same time.

As those skilled in the field will understand, which of the four output signals that are connected to which input port (via an ON/OFF switch) depends on which results that are desired as output signals from the mixer 120. In principle, any of the signals $f_1$, $f_2$, $f_1'$, $f_2'$, can be input to either one of the input ports 121, 122, or in fact to of both the input ports 121, 122 of the mixer.

However, in the example given in FIG. 1, the connections (via the ON/OFF switches $S_1$-$S_4$) from the VCOs 105, 115 to the input ports 121,122 of the mixer 120 are as follows:

The signal at the fundamental frequency $f_1$ of the first VCO 105 and the signal at the fundamental frequency $f_2$ of the second VCO 115 are connected to the first input port 121 and the second input port 122 of the mixer 120 respectively via the switches $S_1$ and $S_4$ respectively; the signal at the second harmonic frequency $f_1'$ of the first VCO 105 and the signal at the second harmonic frequency $f_2'$ of the second VCO 115 are connected to the mixer's second input port 122 and first input port 121 respectively via the switches $S_2$ and $S_3$, respectively.

As is also shown in FIG. 1, the mixer 120 of the tunable signal source 100 is a so called three-input-port mixer, i.e. a mixer which has a third input port 123 in addition to the first 121 and second 122 input ports. The tunable signal source 100 also comprises a third oscillator 125, which in this example of an embodiment is a so called Fixed Frequency Oscillator, an FFO, although the third oscillator can also be a VCO. Suitably, the third oscillator 125 should have a similar phase noise performance to the first and second oscillators, i.e. in this case the VCOs 105, 115. As will be realized, an available signal frequency at the output port 124 of the mixer 120 is the sum of all three input frequencies. For this reason the two VCOs 105, 115, can be used to generate a relatively low-frequency signal, which is then shifted "upwards" by means of the signal from the FFO 125. The frequency of the signal from the FFO 125 will from now on also be referred to as $f_3$ in this text as well as in the appended drawings. Naturally, as one skilled in the art will realize, with three signals as the input to the mixer 120, a multitude of frequencies will be available at the output port 123 of the mixer 120, all of which can be accessed if so desired. Suitably, the desired frequency component is accessed by means of a filter (not shown) at the output port 124 of the mixer 123.

In addition, although the FFO 125 is used in this embodiment to obtain a shift upwards in frequency, the FFO 125 can of course also be used to obtain virtually any other shift, such as, for example a shift downwards in frequency.

The control unit 110 operates to cause the switches $S_1$-$S_4$ to be in the ON or OFF position depending on which frequency it is desired to have as the output frequency of the mixer 120. FIG. 2 is a table which shows the frequency of the output signal at the output port 124 of the mixer 120 as a function of the position of the switches $S_1$-$S_4$, where ON is indicated as "1" and OFF is indicated as "0". In this example, it is assumed that, as described above, the frequencies of the signals from the VCOs 105, 115 which are connected to the input ports of the mixer 120 are as follows:

$S_1$ and $S_4$ connect the fundamental frequencies of the two VCOs to the first input port 121 and the second input port 122, respectively.

$S_2$ and $S_3$ connect the second harmonic frequencies of the two VCOs to the first input port 121 and the second input port 122, respectively.

In addition, the table of FIG. 2 does not show all of the possible combinations of settings of the switches $S_1$-$S_4$, since the table is merely intended to illustrate an example, and shows how to obtain four frequency combinations which are of interest, i.e. $2f_1$, $2f_2$ and $f_1 \pm f_2$. These combinations are shown in the table of FIG. 2 without the frequency from the FFO 125, i.e. $f_3$.

As those skilled in the art will realize, a vast number of combinations are possible with a tunable signal source of the invention, depending on how the frequency ranges of the VCOs 105 and 115 are chosen and how the VCOs are set (i.e. controlled by means of a tuning voltage) within their respective ranges, in combination with how the FFO 125 is chosen, as well as how the switches $S_1$-$S_4$ are set.

However, suitably, the frequency ranges of the two VCOs 105 and 115 are chosen so that the frequency combinations shown in the table in FIG. 2 cover a wide frequency range in a "seamless" fashion. In one example, the fundamental frequency $f_1$ of the first VCO 105 is chosen to be tunable in the range of 9-11 GHz, and the fundamental frequency $f_2$ of the second VCO 115 is chosen to be tunable in the range of 7-8 GHz. If this is the case, the combinations of $f_1$ and $f_2$ in the table of FIG. 2 will be as follows:

$2f_2$: 14-16 GHz
$f_1+f_2$: 16-19 GHZ
$2f_1$: 18-22 GHz

Thus, with the values exemplified above of the ranges of $f_1$ and $f_2$, a frequency range of 14-22 GHz can be covered "seamlessly". An additional "upwards shift" can then be obtained by means of the frequency $f_3$ of the FFO 125. As can be seen, the invention offers a tunable signal source with a wide tuning range.

It should be pointed out that the invention can be varied in a wide variety of ways with respect to the kinds of oscillators used: in the embodiment 100 of FIG. 1, there are two VCOs and one FFO. This can be varied in a large number of ways, with each of the three oscillators being chosen freely as either a VCO or an FFO.

Figures 3, 4:
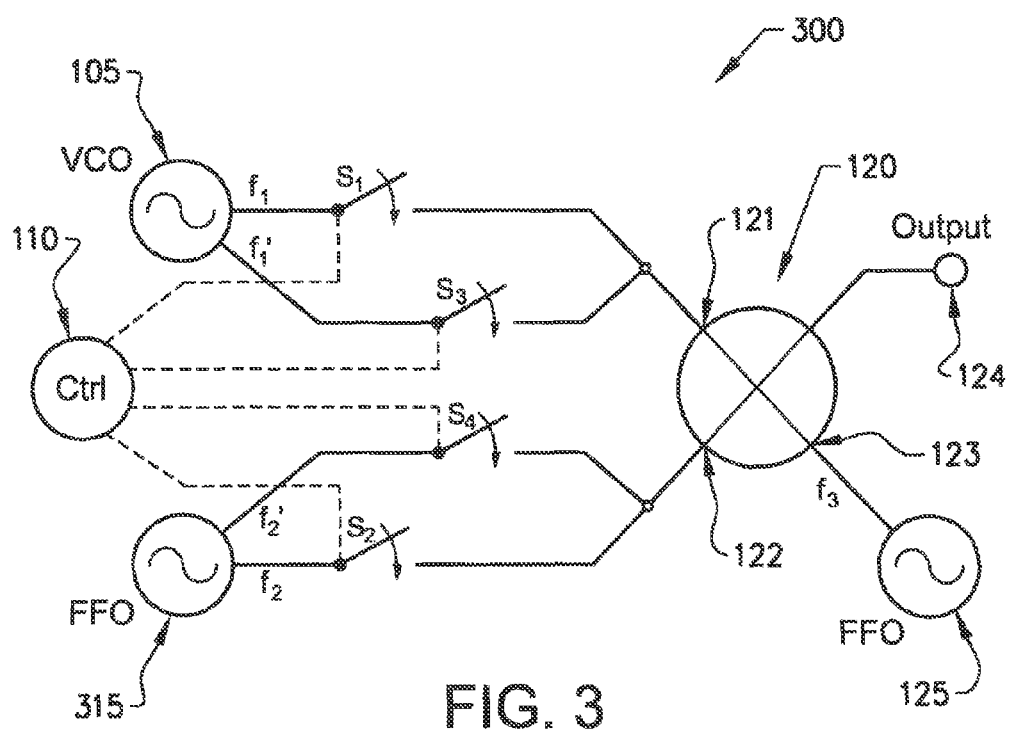
FIG. 3 shows a second embodiment of the invention.
FIG. 4 shows states of the embodiment of FIG. 3.

In an alternative embodiment 300 of the invention shown in shown in FIG. 3, there are two FFOs and one VCO. Components which are also present in the embodiment 100 of FIG. 1 have retained their reference numbers in the embodiment 300 of FIG. 3, meaning that the second FFO which is introduced in FIG. 3 has been given the reference number 315.

The fundamental frequency $f_2$ as well as the second harmonic $f_2'$ of the FFO 315 are both connected to the second input port 122 of the mixer 120 via respective ON/OFF switches $S_2$ and $S_4$, and the fundamental frequency $f_1$ as well as the second harmonic $f_1'$ of the VCO 105 are both connected to the first input port 121 of the mixer 120 via respective ON/OFF switches $S_1$ and $S_3$. All of the ON/OFF switches are controlled by the control unit 110 in order to obtain the desired output frequency at the output port 124 of the mixer 120. Again, in similarity to the embodiment 100 of FIG. 1, which two of the signals $f_1$, $f_1'$, $f_2$, $f_2'$ that are connected to one and the same input port of the mixer 120 via ON/OFF switches is a design issue in principle, all combinations are possible.

If, as an example, the tuning range of the VCO 105 is chosen to be in the range of 8-10 GHZ and the FFO 315 has a fundamental frequency of 6 GHz, the following combinations are among those that can be obtained by means of the switches $S_1$-$S_4$:

$f_1$: 8-10 GHz
$f_2$: 6 GHz
$2f_1$: 16-20 GHz
$2f_2$: 12 GHz
$2f_1-f_2$: 10-14 GHz
$f_1+f_2$: 14-16 GHz
$f_1+2f_2$: 20-22 GHz

As can be seen, the frequency combinations $f_1$, $2f_1-f_2$, $f_1+f_2$, $2f_1$, $f_1+2f_2$, cover the whole frequency region of 8~22 GHz. Those frequency bands and the settings of the switches $S_1$-$S_4$ which are necessary to obtain them are shown in the table of FIG. 4. As with the example of FIG. 1, the frequency range covered by means of the VCO 105 and FFO 315 can then be shifted additionally by means of the FFO 125. For example, the FFO 125 can be chosen to be one which operates at 67 GHz in order to generate an E-band signal at the output from the mixer 120, or to be one which operates at 42 GHz in order to generate a 60 GHz-band signal. Due to the wide band at lower frequencies (8-22 GHz) the up-shifted signal will have a good tuning range.

Turning now to the issue of the phase noise performance of the tunable signal source of the invention, one requirement is that the oscillator which is used to up-shift the signal (such as the FFO 125 in FIG. 3), this oscillator should have a phase noise performance which is comparable to that of the other two oscillators used, and should of course be as low as possible.

The three input-port mixer denoted as 120 in the embodiments shown in FIGS. 1 and 3 is also an important component in a tunable signal source of the invention. A conventional mixer is usually designed to mix only two input signals, as opposed to the three input-port mixer used in the present invention. One general way of obtaining a three input-port mixer is to cascade two two-port mixers. However, this would result in a large DC power consumption and a large chip area. Moreover, an impedance matching network would be needed between two mixers.

Figure 5:
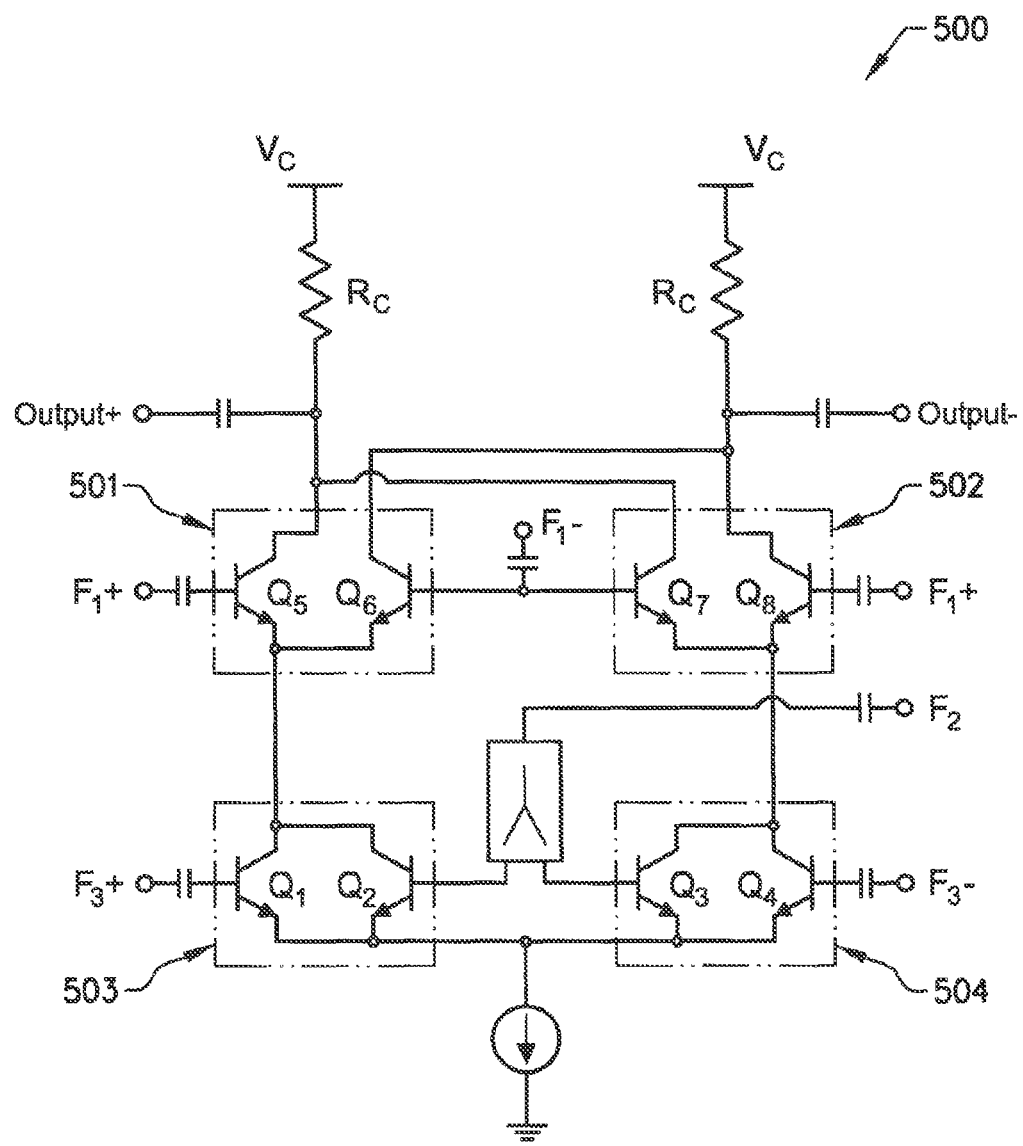
FIG. 5 shows a circuit diagram of a component in the invention.

Thus, in a preferred embodiment, the invention uses a single mixer with three input ports. One example 500 of such a mixer is shown in FIG. 5: the mixer 500 comprises four emitter-coupled pairs of bipolar transistors, shown in FIG. 5 as 503 which comprises transistors Q1 and Q2, 504 which comprises transistors Q3 and Q4, 501 which comprises transistors Q5 and Q6 and 502 which comprises transistors Q7 and Q8. The emitters of the pair Q5-Q6 are also connected to the collectors of the pair Q1-Q2, and the emitters of the pair Q7-Q6 are connected to the collectors of the pair Q3-Q4. The collector of Q5 is connected to the collector of Q7, and the collector of Q6 is connected to the collector of Q8.

The differential input signal of a first oscillator at frequency $f_1$ is input at the bases of the emitter coupled pairs, $Q_5$ with $Q_6$ and $Q_7$ with $Q_8$, while the input signals at frequencies $f_2$ from a second of the other two oscillators is input to the bases of one transistor in each of the pairs Q1-Q2 and Q3-Q4, with the differential signal at frequency $f_3$ from the third oscillator being input at the base of the other transistor in these pairs. It should be pointed out that the input-ports for the signal at frequency $f_1$ and the signal at $f_3$ can be exchanged.

The invention is not limited to the examples of embodiments described above and shown in the drawings, but may be freely varied within the scope of the appended claims.

The invention claimed is:
1. A frequency tunable signal source comprising:
a first oscillator for outputting a first signal (S1) having a first frequency (F1) and for outputting a second signal (s1') having a frequency (F1') that is a harmonic of the first frequency;
a second oscillator for outputting a third signal (s2) having a third frequency (F2) and for outputting a fourth signal (s2') having a frequency (F2') that is a harmonic of the third frequency;
a mixing circuit having a first input port, a second input port, a third input port, and an output port;
a plurality of switches comprising: a first switch for switchably connecting s1 with the first input port of the mixing circuit, a second switch for switchably connecting s2 with the second input port of the mixing circuit, a third switch for switchably connecting s1' with the first input port of the mixing circuit, and a fourth switch for switchably connecting s2' with the second input port of the mixing circuit;
a control unit for controlling said first, second, third and fourth switches;
a third oscillator having an output port connected to the third input port of the mixing circuit and for outputting via its output port a fifth signal (s3), wherein
at least one of said oscillators is a voltage controlled oscillator (VCO).

2. The frequency tunable signal source of claim 1, wherein the third oscillator is a fixed frequency oscillator.

3. The frequency tunable signal source of claim 1, wherein at least one of the first and second oscillators is a VCO.

4. The frequency tunable signal source of claim 1, wherein one of the first and second oscillators is a fixed frequency oscillator.

5. The frequency tunable signal source of claim 1, wherein both the first and the second oscillators are VCOs with tuning ranges which do not have an overlap.

6. The frequency tunable signal source of claim 1, wherein F1'=2×F1 and F2'=2×F2.

7. The frequency tunable signal source of claim 1, wherein the control unit is configured such that the control unit controls the first switch and the third switch such that s1 and s1' are not connected to the first input port of the mixing circuit at the same time.

8. The frequency tunable signal source of claim 7, wherein the control unit is configured such that the control unit controls the second switch and the fourth switch such that s2 and s1' are not connected to the second input port of the mixing circuit at the same time.

9. The frequency tunable signal source of claim 1, wherein the mixing circuit comprises a first mixer having two input ports and a second mixer having two input ports.

10. The frequency tunable signal source of claim 1, wherein the mixing circuit comprises a single three-input port mixer.

* * * * *

UNITED STATES PATENT AND TRADEMARK OFFICE
CERTIFICATE OF CORRECTION

PATENT NO. : 8,766,730 B2  
APPLICATION NO. : 13/641841  
DATED : July 1, 2014  
INVENTOR(S) : Bao et al.

Page 1 of 1

It is certified that error appears in the above-identified patent and that said Letters Patent is hereby corrected as shown below:

On the Title Page, below Item (65), insert Item -- (30) Foreign Application Priority Data
Aug. 8, 2011 (JP)........................ 2011-173182 --.

In the Specification,

In Column 2, Line 15, delete "invention, and" and insert -- invention, --, therefor.

In Column 2, Line 16, delete "FIG. 1, and" and insert -- FIG. 1, --, therefor.

In Column 2, Line 17, delete "invention, and" and insert -- invention, --, therefor.

In Column 3, Line 41, delete "mixer 123." and insert -- mixer 120. --, therefor.

Signed and Sealed this
Twentieth Day of January, 2015

Michelle K. Lee
*Deputy Director of the United States Patent and Trademark Office*